United States Patent [19]

Byers et al.

[11] Patent Number: 4,778,332

[45] Date of Patent: Oct. 18, 1988

[54] WAFER FLIP APPARATUS

[75] Inventors: William Byers, Milford; Peter Kochersperger, Greenwich, both of Conn.

[73] Assignee: The Perkin-Elmer Corporation, Norwalk, Conn.

[21] Appl. No.: 12,537

[22] Filed: Feb. 9, 1987

[51] Int. Cl.⁴ .............................................. B66C 1/00
[52] U.S. Cl. .................................... 414/735; 269/21; 269/71; 414/737; 414/779
[58] Field of Search ............... 414/763, 772, 776, 779, 414/783, 735, 737, 738, 744 B; 901/29, 40, 15, 49, 50; 269/21, 71; 403/93, 96, 328, DIG. 6

[56] References Cited

U.S. PATENT DOCUMENTS

| | | | |
|---|---|---|---|
| 3,437,929 | 4/1969 | Glenn | 269/21 X |
| 3,499,640 | 3/1970 | Berz | 269/21 |
| 3,700,228 | 10/1972 | Peale | 269/71 X |
| 3,711,081 | 1/1973 | Cachon | 269/21 |
| 3,841,499 | 10/1974 | Bullard | 414/783 X |
| 3,960,277 | 6/1976 | Flint | 414/783 X |
| 4,042,122 | 8/1977 | Espy et al. | 414/776 X |
| 4,073,201 | 2/1978 | Taylor et al. | 901/29 X |
| 4,188,166 | 2/1980 | Moreau et al. | 901/15 X |
| 4,226,569 | 10/1980 | Gerard et al. | 414/737 |
| 4,262,891 | 4/1981 | Kinney | 269/71 |
| 4,370,091 | 1/1983 | Gagliardi | 414/738 X |
| 4,406,576 | 9/1983 | Inaba et al. | 414/735 |
| 4,431,366 | 2/1984 | Inaba et al. | 414/738 X |
| 4,444,492 | 4/1984 | Lee | 269/21 X |
| 4,557,514 | 12/1985 | Cushman | 269/21 X |
| 4,566,726 | 1/1986 | Correnti et al. | 414/737 X |
| 4,568,070 | 2/1986 | Severt | 269/71 X |
| 4,684,312 | 8/1987 | Antoszewski et al. | 901/29 X |

FOREIGN PATENT DOCUMENTS

| | | | |
|---|---|---|---|
| 0240166 | 10/1986 | German Democratic Rep. | 901/29 |
| 2102763 | 2/1983 | United Kingdom | 901/29 |
| 2126559 | 3/1984 | United Kingdom | 901/15 |
| 8200431 | 2/1982 | World Int. Prop. O. | 901/49 |

*Primary Examiner*—Robert J. Spar
*Assistant Examiner*—P. McCoy Smith
*Attorney, Agent, or Firm*—Thomas P. Murphy; Edwin T. Grimes; Francis L. Masseller

[57] ABSTRACT

Apparatus is disclosed for automatically transferring a semiconductor wafer between a horizontal and a vertical plane, beginning and ending in precisely located positions. A wafer support arm is carried by a transfer member which also includes a motor for rotating the support arm between a "start" position and an intermediate position in a horizontal plane. Another motor is provided for rotating the transfer member to position the support arm in a vertical plane. The wafer support arm is then returned to its original position relative to the transfer member, thus establishing a "finish" position in the vertical plane.

10 Claims, 5 Drawing Sheets

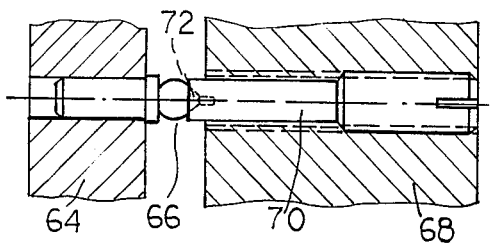
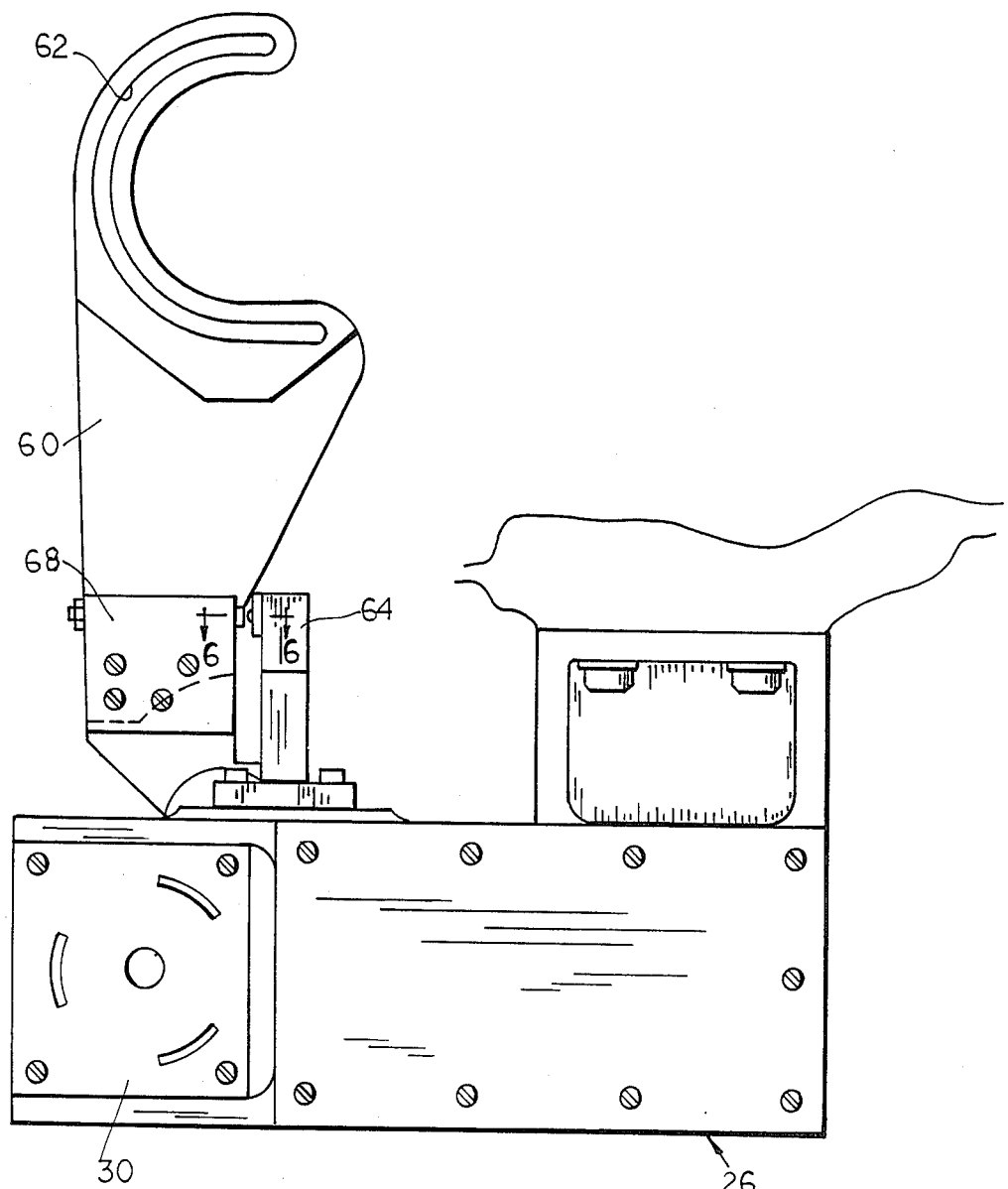

WAFER FLIP APPARATUS

FIELD OF INVENTION

This invention pertains generally to the field of automated handling of semiconductor wafers during the manufacture of semiconductor chips and more particularly to the precise positioning of a chip in different planes.

BACKGROUND OF THE INVENTION

As the circuitry deposited on semiconductor chips has become even smaller, automated handling and precise positioning have become more and more important. The reduction in the size of the circuit elements has come to be limited by the wavelength of the light used to expose the photo resist. This problem has been met by employing light in the ultraviolet, and even in the X-ray regions of the spectrum. Considering the smallness of the circuit elements and the need for precisely overlaying each circuit over previous ones, the importance of each positioning of the wafer will be obvious.

It will also be obvious that dust and other foreign matter must be kept away from the wafer during processing. This practically necessitates the use of automatic handling equipment which may be housed in a closely controlled environment.

SUMMARY OF THE INVENTION

This apparatus comprises a wafer support arm which is carried by a transfer member and is rotatable in a first plane between an established "start" position and an intermediate position. Means are provided for rotating the transfer member to position the wafer support arm in a second plane, and means are provided for establishing a "finish" position. The start and the finish positions are substantially the same, relative to the transfer member.

Accordingly, it is a primary object of the present invention to provide apparatus which will automatically move a wafer from a precisely located position in a horizontal plane to an equally precisely established position in a vertical plane. Other objects, features, and advantages will become apparent from the following description and appended claims.

BRIEF DESCRIPTION OF THE DRAWINGS

FIG. 2 is a top view of the actual apparatus.

FIG. 6 is an enlarged cross-section taken substantially along the line 6—6 of FIG. 2.

DETAILED DESCRIPTION OF THE INVENTION

Figure 1:
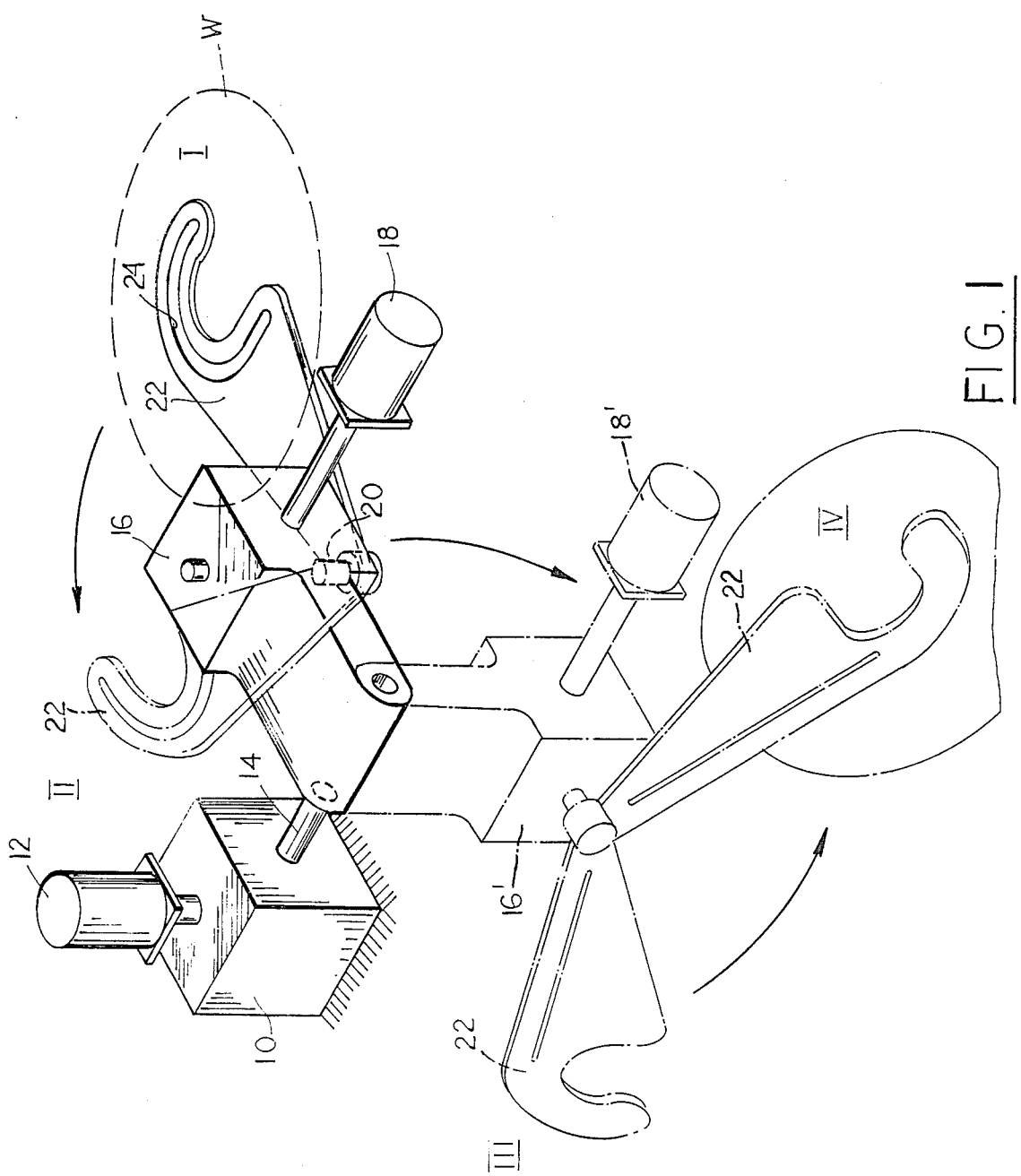
FIG. 1 is a schematic diagram illustrating the principle of operation of the apparatus of the invention.

FIG. 1 illustrates schematically the manner in which a wafer W is moved from a start position I in a horizontal plane to a final position IV in a vertical plane. (The manner by which the initial and final positions are established will be explained in connection with the description of the actual apparatus shown in FIGS. 2-5). A fixed housing 10 carries a motor 12 which, through a gear train (not shown) enclosed in housing 10, drives an output shaft 14. Mounted to the output shaft 14 for rotation therewith is a transfer member 16. Transfer member 16 also carries a motor 18 which, through a similarly enclosed gear train, drives an output shaft 20. Mounted to the shaft 20 is a conventional wafer support arm 22, the end of which is C-shaped and includes a vacuum groove 24 for firmly holding a wafer W.

Transfer of the wafer W begins with motor 18 turning the shaft 20 to retract the wafer support arm 22 to an intermediate position II. This move is necessary to permit the wafer W to avoid intervening obstructions between the initial position I and the final position IV. The motor 12 is then actuated so as to turn the shaft 14 and rotate the transfer member 16, together with its motor 18 and its support arm 22, clockwise as viewed in FIG. 1 to the dotted line position 16' to thereby locate the arm 22 in position III. The motor 18' is once more actuated to return the arm 22 to essentially the same initial position, relative to the transfer members position 16', but otherwise into a final position IV in the vertical plane.

Figure 3:
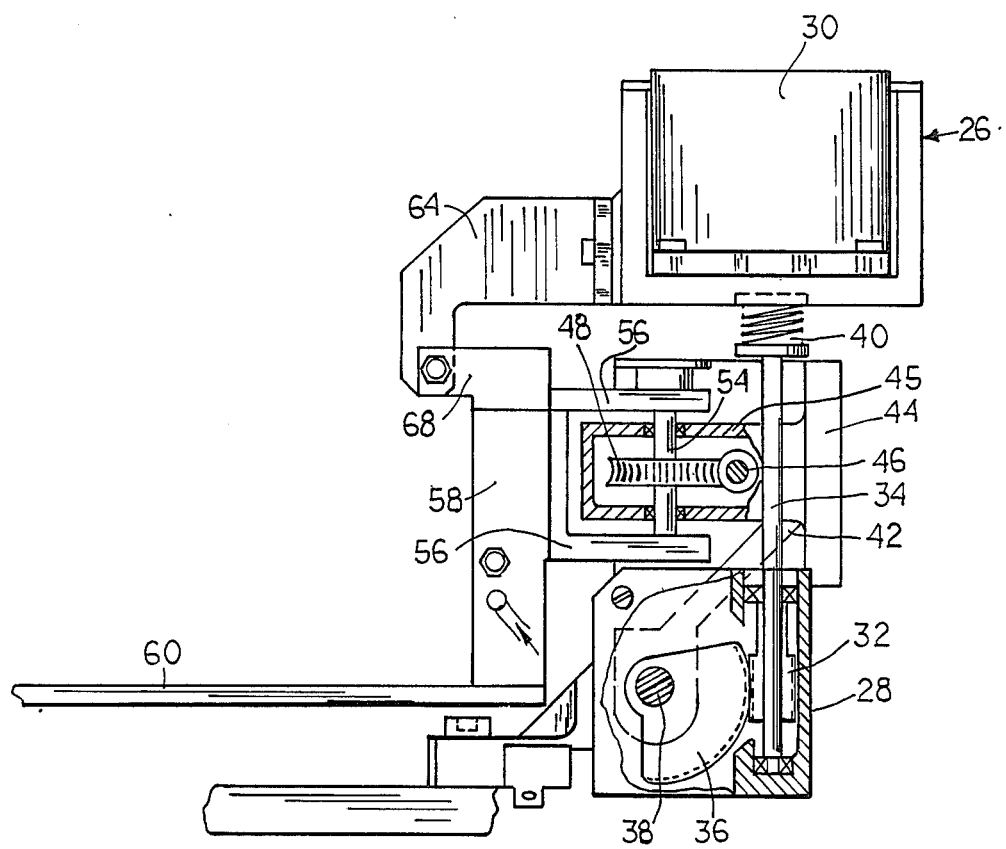
FIG. 3 is a left end view of the apparatus of FIG. 3, portions thereof being cut away to illustrate its internal construction.
Figure 4:
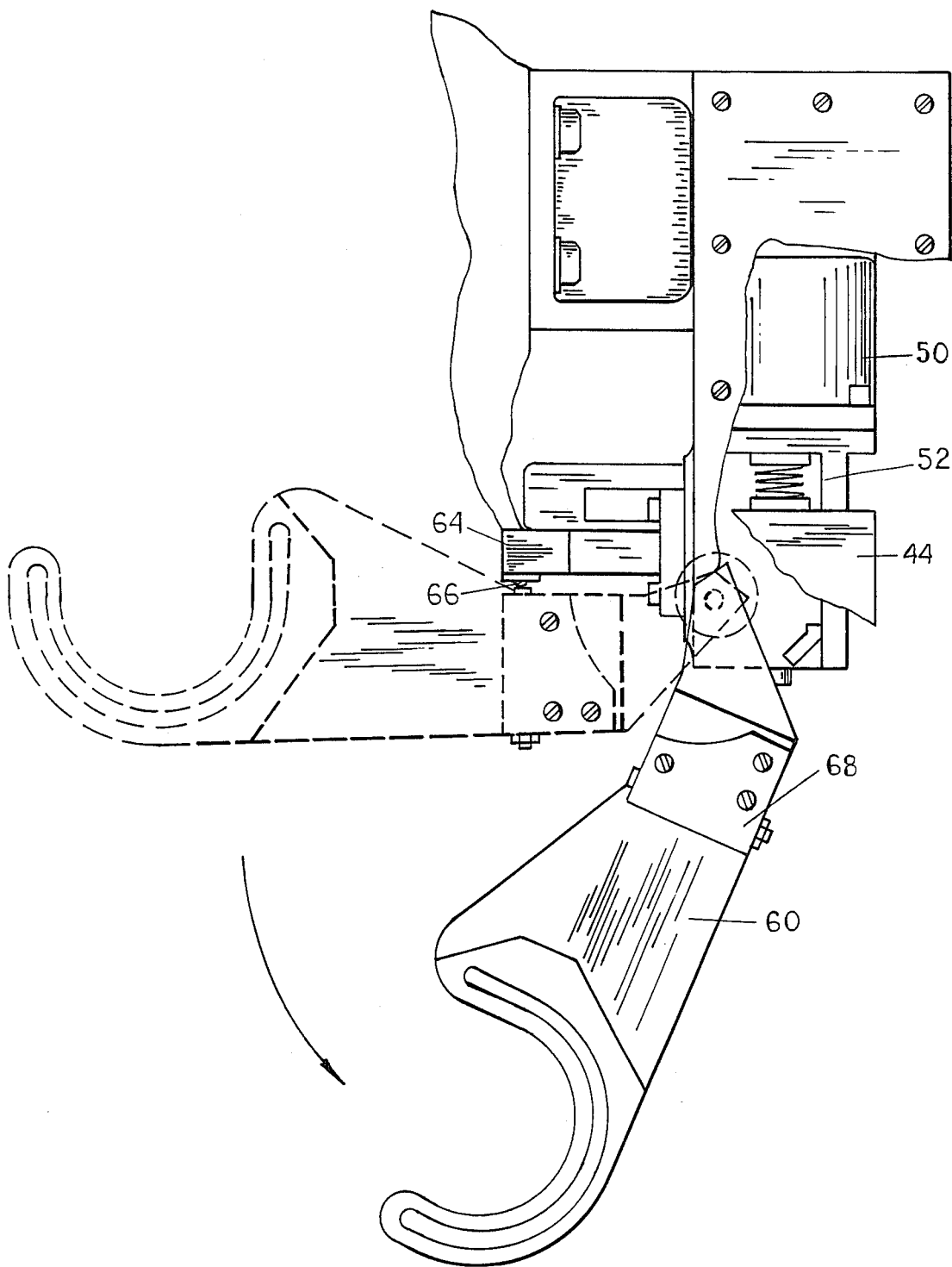
FIG. 4 is a view similar to FIG. 2, partially broken away and illustrating the wafer support arm in a retracted intermediate position.
Figure 5:
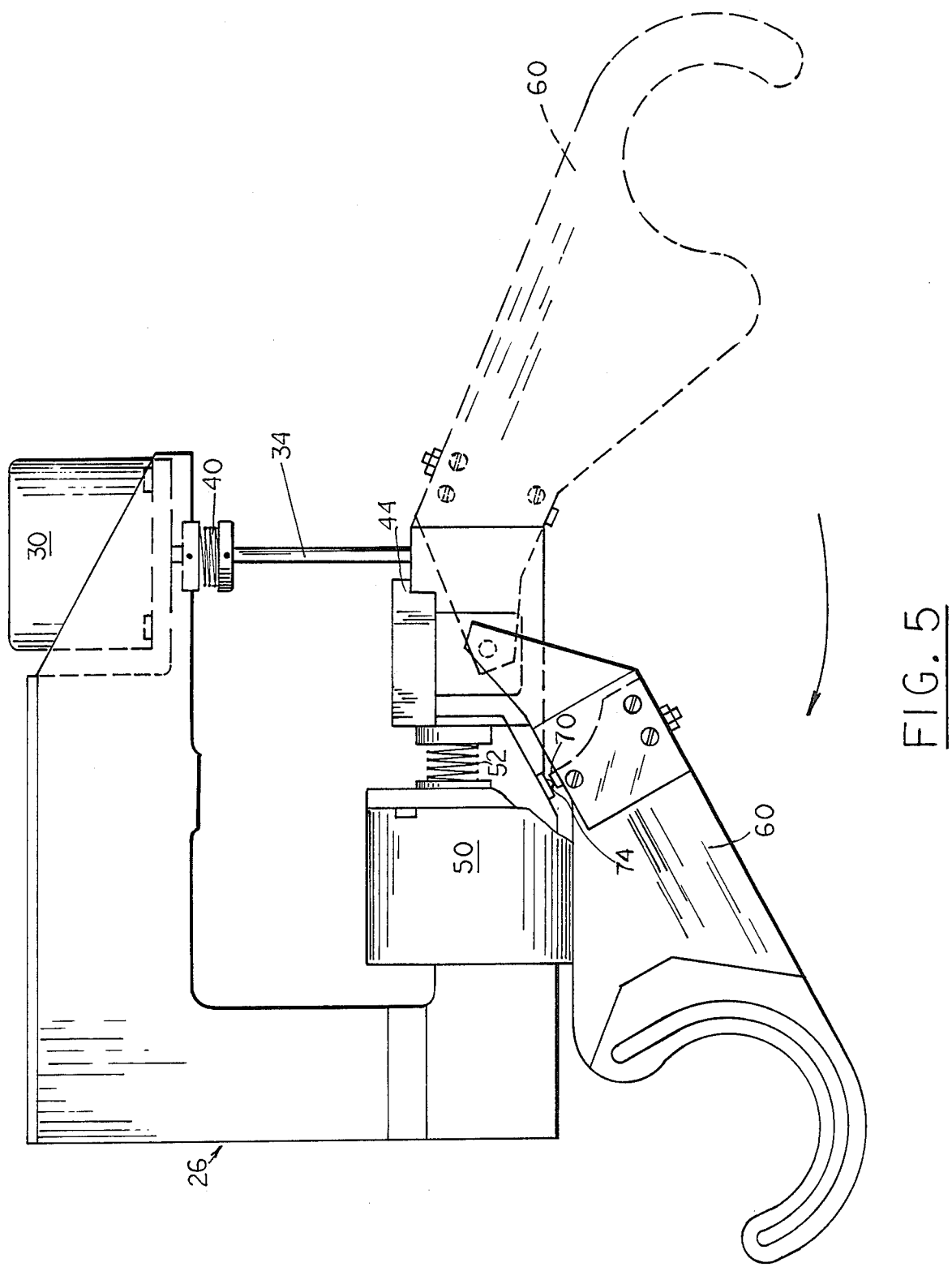
FIG. 5 is an elevational view of the apparatus of FIGS. 3-4, illustrating the final movement of the wafer support arm.

A specific application of the principle illustrated in FIG. 1 will now be described in detail, referring to FIGS. 2-5. With particular reference to FIGS. 2 and 3 there is illustrated a support 26 which supports a base 28 and motor 30. The base 28 encloses a gear train comprising a worm 32 mounted on an input shaft 34 and a sector gear 36 mounted on an output shaft 38. The input shaft 34 is driven by the motor 30 through a flexible coupling 40.

Mounted to the shaft 38 is a transfer member 44. Arm 42 and transfer member 44 are preferably made of one integrated piece. Transfer member 44 carries a housing 45 which encloses a gear train comprising worm 46 and gear 48. This gear train is driven by a motor 50 (FIG. 4) through a flexible coupling 52. The output shaft 54 extends through the opposite sides of the housing 45 and is connected to a pair of hub arms 56. Depending from the hub arms 56 is a bracket 58 which carries at its lower end a wafer support arm 60. Wafer support arm 60 is of conventional construction, having a C-shaped end defining a vacuum groove 62 as seen in FIG. 2. A vacuum is supplied to vacuum groove 62 by vacuum inlet 61 on bracket 58.

Extending outwardly from the support 26 is a ball mount bracket 64 (FIG. 2) which carries a tooling ball 66. Extending upwardly from the bracket 58 is a block 68 into which is threaded an initial placement rod 70 which defines at its end a concave cone 72 (FIG. 6). A final placement rod 71, similar to initial placement rod 70, extends through bracket 58. As will be seen in FIG. 6, the cone 72 mates with the initial placement ball 66 to provide a very accurate initial starting point for movement of the arm 60. A precise final position for arm 60 is provided by a similar final placement ball 74 which is carried by the base 28 on its lower opposite side, as will be seen in FIG. 5.

FIGS. 2 and 3 illustrate the initial position of the arm 60. With the arm in this position, the motor 50 begins to turn and, through the worm 46 and the gear 48, rotates the hub arms 56 and the associated elements, including the wafer support arm 60, counter-clockwise as viewed from above to an intermediate position illustrated in FIG. 4. The exact position where the wafer support arm 60 stops is not critical. The only critical positions are the initial and final ones and these are established by the two ball and cone stops. Retraction of the arm 60 to the FIG. 4 position assures avoiding contact with underlying mechanisms during the downward rotation.

The motor 30 next begins to turn. This motor, through the worm 32 and the sector gear 36, rotates the transfer member 44 and the entire mechanism associated with it including housing 45, the gear train 46, 48 and the motor 50 downwardly and counter-clockwise as viewed in FIG. 3. As a result of this motion, the arm 60 is positioned in a vertical plane as seen in phantom in FIG. 5.

In the next movement, the motor 50 operates in the reverse of this initial motion to thereby return the arm 60 to essentially the same position relative to the transfer member 44. However, the wafer support arm 60 is now positioned such that the cone in the final placement rod 71 seats against the final placement ball 74, thereby insuring accurate final placement.

Upon completion of this cycle, the movements are reversed. This returns the wafer support arm to its initial position from which the cycle may be repeated.

It is believed that the many advantages of this invention will now be apparent to those skilled in the art. It will also be apparent that a number of variations and modifications may be made therein without departing from its spirit and scope. Accordingly, the foregoing description is to be construed as illustrative only, rather than limiting. This invention is limited only by the scope of the following claims.

What is claimed is:

1. Apparatus for transferring a semiconductor wafer from a preestablished start position in a first plane to a preestablished finish position in a second plane, which comprises:
   a base member;
   first drive means mounted on said base member;
   a transfer member connected to said first drive means for rotation thereby between first and second positions;
   a wafer support arm carried by said transfer member and rotatable therewith between said first plane and said second plane;
   second drive means carried by said transfer member for rotating said wafer support arm from said start position to an intermediate position in said first plane and from said intermediate position to said finish position in said second plane, said start and finish positions being substantially the same relative to said transfer member;
   a support member attached to said base member, and wherein;
   said base member includes a first limit stop for establishing said start position;
   said support member includes a second limit stop for establishing said finish position; and
   said wafer support arm carries at least one third limit stop engagable with either of said first and second limit stops.

2. The apparatus of claim 1 wherein said at least one third limit stop comprises one of a ball or concave cone and each of said first and second limit stops comprise the other of said ball or concave cone.

3. The apparatus of claim 1 wherein said first drive means comprises a motor and gear train.

4. The apparatus of claim 3 wherein said second drive means comprises a motor and gear train.

5. The apparatus of claim 1 wherein said first and second planes are substantially perpendicular.

6. The apparatus of claim 1 wherein said wafer support arm defines a vacuum groove for securing said semiconductor wafer thereto.

7. The apparatus of claim 2 wherein each of said first and second drive means comprises a motor and gear train.

8. The apparatus of claim 7 wherein said first and second planes are substantially perpendicular.

9. The apparatus of claim 8 wherein said wafer support arm defines a vacuum groove for securing said semiconductor wafer thereto.

10. A device for transferring a semiconductor wafer from a first predetermined location in a first plane to a second predetermined location in a second plane comprising:
    a support;
    a transfer member rotatably attached to said support;
    means attached to said support for rotating said transfer member about an axis parallel to the first plane;
    a wafer support arm rotatably attached to said transfer member;
    means attached to said transfer member and capable of moving therewith, for rotating said wafer support arm;
    first means associated with said support and said wafer support arm for precisely locating in the first plane said wafer support arm relative to said support;
    second means associated with said support and said wafer support arm for precisely locating in the second plane said wafer support arm relative to said support;
    said first and second means for precisely locating comprises mating balls and concave cones.

* * * * *